United States Patent

Glazunov et al.

(10) Patent No.: US 8,541,930 B2
(45) Date of Patent: Sep. 24, 2013

(54) PIEZOELECTRIC COMPONENT

(75) Inventors: Alexander Glazunov, Deutschlandsberg (AT); Oliver Dernovsek, Lieboch (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/276,791

(22) Filed: Oct. 19, 2011

(65) Prior Publication Data

US 2012/0062075 A1    Mar. 15, 2012

Related U.S. Application Data

(63) Continuation of application No. PCT/EP2010/056912, filed on May 19, 2010.

(30) Foreign Application Priority Data

May 29, 2009 (DE) .......................... 10 2009 023 356
Sep. 28, 2009 (DE) .......................... 10 2009 043 220

(51) Int. Cl.
   *H01L 41/08* (2006.01)
(52) U.S. Cl.
   USPC ..................... 310/358; 310/328; 262/52.9 PZ
(58) Field of Classification Search
   USPC ................................................. 310/328, 358
   See application file for complete search history.

(56) References Cited

U.S. PATENT DOCUMENTS

| 5,300,852 | A  | * | 4/1994  | Isogai et al. ........... 310/358 |
| 5,507,898 | A  | * | 4/1996  | Aoki et al. ........... 156/89.14 |
| 6,858,971 | B2 | * | 2/2005  | Ikeda et al. .......... 310/331 |
| 7,420,319 | B2 | * | 9/2008  | Kastl et al. .......... 310/363 |
| 7,456,548 | B2 | * | 11/2008 | Kubota et al. ......... 310/324 |
| 2001/0040420 | A1 | * | 11/2001 | Watanabe et al. ...... 310/311 |
| 2005/0035686 | A1 | * | 2/2005  | Florian et al. ........ 310/328 |
| 2006/0055288 | A1 |   | 3/2006  | Heinzmann et al. |
| 2006/0238073 | A1 |   | 10/2006 | Ragossnig et al. |
| 2010/0109488 | A1 |   | 5/2010  | Doellgast et al. |

FOREIGN PATENT DOCUMENTS

| DE | 102 01 641 A1    | 8/2003  |
| DE | 102 34 787 C1    | 10/2003 |
| DE | 103 07 825 A1    | 9/2004  |
| DE | 10 2005 052 686 A1 | 2/2007 |
| EP | 1 808 906 A2     | 7/2007  |
| WO | WO 2008/138906 A1 | 11/2008 |
| WO | WO 2010/136367 A1 | 12/2010 |

* cited by examiner

*Primary Examiner* — Mark Budd
(74) *Attorney, Agent, or Firm* — Slater & Matsil, L.L.P.

(57) ABSTRACT

A piezoelectric component includes a stack of piezoelectric layers arranged one on top of the other and first and second electrode layers arranged therebetween. The stack includes at least one first piezoelectric layer having a first electrical coercive force and directly adjacent thereto at least one second piezoelectric layer having a second electrical coercive force different from the first coercive force.

20 Claims, 5 Drawing Sheets

PIEZOELECTRIC COMPONENT

This application is a continuation of co-pending International Application No. PCT/EP2010/056912, filed May 19, 2010, which designated the United States and was not published in English, and which claims priority to German Application No. 10 2009 023 356.3, filed May 29, 2009 and to German Application No. 10 2009 043 220.5, filed Sep. 28, 2009, each of which is incorporated herein by reference.

TECHNICAL FIELD

A piezoelectric component comprising piezoelectric layers is specified.

BACKGROUND

Piezoelectric components such as, for instance, multilayered piezoelectric actuators consist of a plurality of layers of a piezoelectric material with internal electrodes between the piezoelectric layers. Usually, the same piezoelectric material is used in the entire actuator. Piezoelectric actuators furthermore have a multiplicity of internal electrodes which are arranged one above another and are contact-connected with alternate electrical polarity and between which the piezoelectric material can deform depending on the applied voltage at the internal electrodes. In order for the internal electrodes to be contact-connected in a simple manner, usually only internal electrodes respectively assigned to the same electrical polarity are arranged in a so-called inactive region. The internal electrodes assigned to the other electrical polarity do not extend right to the edge of the actuator at this location, but rather are delimited to an area in the interior of the actuator. Therefore, almost no expansion of the piezoelectric material takes place in the inactive region when an electrical voltage is applied, which leads, in the edge zone of the inactive region, to a tensile loading as a result of the expansion in the active region. Consequently, the tensile stresses occurring at the edge of the inactive region also rise depending on the number of piezoelectric layers and the applied electrical voltage.

The reliability of a multilayered piezoelectric actuator is crucially dependent on combating cracks that may occur. During lamination-thermal processes such as sintering at maximum temperatures of 800 to 1500° C., metallization and soldering and also during polarization, elastic stresses arise on account of the above-described different expansion in the active (driven) and inactive (insulating) region, the elastic stresses leading to so-called load-relieving cracks and/or polarization cracks. These can run in the inactive region or else along an electrode layer. Upon transition into the active region, the cracks can bend away in an uncontrolled manner. If a crack bridges at least two electrodes in this case, short circuits can arise, which leads to the failure of the piezoelectric actuator.

German publications DE 102 34 787 C1 and DE 103 07 825 A1 disclose piezo-electric actuators wherein porous structures are provided, which have less strength than the remaining piezoelectric layers. The increased porosity is produced by using an increased proportion of an organic binder in these regions in comparison with the binder content in the remaining piezoelectric layers.

SUMMARY OF THE INVENTION

In one aspect, a piezoelectric component is specified which avoids or at least reduces uncontrolled cracking.

A piezoelectric component in accordance with one embodiment comprises, in particular, a stack composed of piezoelectric layers arranged one above another and first and second electrode layers arranged therebetween, wherein the stack has at least one first piezoelectric layer having a first electric coercive field strength and, directly adjacent thereto, a second piezoelectric layer having a second electric coercive field strength different than the first coercive field strength.

In particular, the piezoelectric component can be embodied as a piezoactuator of multilayer design.

The piezoelectric component is thus characterized, in particular, in that piezoelectric layers having different coercive field strengths which are directly adjacent to one another are used. The coercive field strength determines how well the piezoelectric material is polarized upon the application of an electric field having a predetermined strength, and hence inter alia also how large the elastic expansion and stress in the material will be. If two materials having different coercive field strengths are brought into contact with one another, it is possible that at their contact boundary a difference in elastic stresses arises during polarization, which difference can foster the formation of load-relieving and/or polarization cracks at the contact boundary between the two materials. Here and hereinafter, the coercive field strength of a layer of the stack of piezoelectric layers is in this case understood to mean the electric coercive field strength of the layer.

In the case of the piezoelectric component described here it is thus advantageously possible to predetermine a location where the load-relieving and/or polarization cracks arise, and subsequently the course of the cracks substantially parallel to the electrode layers, in order to prevent or at least to reduce uncontrolled growth transversely with respect to the electrode layers. By contrast to load-relieving and/or polarization cracks which bridge at least two electrode layers, cracks running parallel or at least substantially parallel to the internal electrodes constitute, by contrast, almost no risk to the service life of actuators. This holds true all the more in that, for the piezoelectric component described herein, the first and second piezoelectric layers are in each case chosen in such a way that a contact boundary between the two layers forms a region for forming load-relieving and/or polarization cracks which run parallel or at least substantially parallel to the electrode layers. In this case, "substantially parallel" means here and hereinafter that, although the load-relieving and/or polarization cracks do not necessarily run completely rectilinearly and parallel in the mathematical sense, they nevertheless run with a main extension direction along the electrode layers and in this case do not have any course which can bridge two electrode layers.

By means of the first and second piezoelectric layers having different coercive field strengths, by way of example, during thermal treatments, during metallization, during soldering, during the polarization process and/or during the operation of the piezoelectric component, local elastic stresses can be produced in the stack of the piezoelectric component, which stresses are intended to lead to the targeted cracking. By virtue of the at least one first and one second piezoelectric layer introduced in a defined manner, different polarization states for instance during the polarization process at the contact boundary between the first and second piezoelectric layers can lead to polarization cracks. The polarization cracks run parallel or substantially parallel to the electrode layers. Uncontrolled crack growth transversely with respect to the electrode layers is thus prevented, without porous structures known from the prior art, for instance, having to be introduced into the piezoelectric component.

The first and second piezoelectric layers can have different coercive field strengths by virtue of the fact that they differ in their composition, which can mean, in particular, that they comprise different ceramic materials, different dopants, different dopant concentrations or different particle sizes of starting materials respectively used. Furthermore, the first and second piezoelectric layers can have different layer thicknesses. In order to produce the first and second piezoelectric layers with different coercive field strengths, they can differ in exactly one of the abovementioned properties or else in a plurality of the abovementioned properties. In this case, according to the inventors' insight, it can be advantageous with regard to the processability and the economic viability of the production process if the first and second piezoelectric layers differ in exactly one or just a few of the abovementioned properties. The greater the number of properties differentiating the first and second piezoelectric layers, the greater, on the other hand, however, the degree of freedom in the production of the first electric coercive field strength can advantageously also be in comparison with the second electric coercive field strength.

The first and second piezoelectric layers can in each case comprise a ceramic material formed in each case from a plurality of constituents which are present with certain respective concentrations. In this case, the first and second piezoelectric layers can differ in the concentration of at least one constituent. By way of example, the first piezoelectric layer can comprise a lead-containing ceramic material, for instance based on lead zirconate titanate (PZT), while the second piezoelectric layer comprises a lead-free ceramic material. As an alternative thereto, the first and second piezoelectric layers can also comprise in each case a lead-free ceramic material and differ in one of the abovementioned properties.

Furthermore, the first piezoelectric layer can comprise a first ceramic material and the second piezoelectric layer can comprise a second ceramic material. The first and second ceramic materials can each comprise the same constituents and in this case differ in the concentration of at least one constituent. This will be described hereinafter on the basis of the example PZT, although the following description is not restricted to this ceramic material and likewise applies to any other piezoelectric material. In the case of PZT as first and second ceramic material, the first and second piezoelectric layers can differ from one another, for example, in the titanium content, that is to say the respective concentration of the constituent titanium. Furthermore, the first and second piezoelectric layers can also differ exclusively in the titanium content, while other properties such as, for instance, the respective doping of the first and second piezoelectric layers are identical.

The inventors have discovered, in particular, that a ceramic material for the first and second piezoelectric layers can be advantageous which has a so-called morphotropic phase boundary. That can mean, in particular, that the first and second piezoelectric layers comprise a ceramic material having the same constituents and the ceramic material, depending on the concentration of at least one first constituent, has a morphotropic phase boundary lying between a first structure and a second structure of the ceramic material. The concentration of the first constituent of the ceramic material in the first and second piezoelectric layers is in each case chosen in such a way that the first piezoelectric layer comprises the ceramic material having a first structure and the second piezoelectric layer comprises the ceramic material having the second structure. In this case, the first and second ceramic materials then differ in their respective composition, in particular in the respective concentration of exactly the first constituent mentioned above, by virtue of the fact that a transition between the first and second structures depending on the concentration of the constituent is characterized by a phase transition at the morphotropic phase boundary. In this case, the morphotropic phase boundary need not identify a sharply defined phase transition, but can also constitute a continuous course between two crystal structures. By virtue of the different first and second structures, the first and second piezoelectric layers can in this case have different coercive field strengths.

By way of example, PZT has a morphotropic phase boundary in a range of approximately 50 mol % titanium and approximately 50 mol % zirconium, wherein these values are dependent on the exact composition of the ceramic material. Thus, there is a composition of PZT which has a morphotropic phase boundary given approximately 46 mol % of the constituent titanium. With an increasing titanium content, starting from less than 46 mol % titanium, the coercive field strength rises upon the morphotropic phase boundary being exceeded, such that, for the piezoelectric component, for example, the first piezoelectric layer can be chosen with a titanium content of less than 46 mol % and the second piezoelectric layer can be chosen with a titanium content of more than 46 mol %.

Selection of a ceramic material for the first and second piezoelectric layers which is identical with regard to its constituents and which differs in the concentration of at least one constituent for the first and second piezoelectric layers affords the advantage that precise control of the elastic stresses at the contact boundary, that is to say the interface, between the first and second piezoelectric layers is made possible. Furthermore, it is possible to adapt the first and second coercive field strengths by means of the difference in the concentration of the at least one constituent, that is to say, in the example described above, for instance by means of the change in the titanium content. Furthermore, additionally added dopants can be present in identical dopant concentrations in this case. This can afford particular advantages during the processing of the piezoelectric component, since possible chemical inhomogeneities between the first and second piezoelectric layers can be minimized and can thus be minimal in the piezoelectric component and therefore have no influence on the sintering behavior of the piezoelectric layers. In particular in the case of different dopants and/or dopant concentrations, the sintering behavior of ceramic materials can be greatly changed, such that specific adaptation of the sintering shrinkage between such different materials is then necessary.

Furthermore, the first and second piezoelectric layers can differ in their composition to the effect that the first and second piezoelectric layers comprise ceramic materials produced from starting powders having different particle sizes. The ceramic layers of a piezoelectric component are typically produced from so-called green sheets, which comprise unsintered ceramic powder alongside further constituents such as, for instance, sintering auxiliaries, wherein the green sheets are subsequently joined together with the electrode layers and sintered. The inventors have discovered that ceramic materials which are identical for instance in their chemical composition and differ in the starting sizes of the powders before the sintering process are suitable for producing the first and second piezoelectric layers. Ceramic materials comprising a coarser starting powder usually have coarser grains after the conclusion of the sintering process, which can lead to a reduction of the coercive field strength.

In this case, the particle size is preferably specified as a median value d50, known to the person skilled in the art, of the distribution of the particle sizes in the respective ceramic material. The particle size d50 of the starting powders of the first and second piezoelectric layers before the sintering process can preferably be greater than or equal to 0.3 µm and less than or equal to 2.0 µm, and particularly preferably greater than or equal to 0.4 µm and less than or equal to 1.2 µm.

If a difference in the coercive field strengths of the first and second layers is intended to be achieved by means of the difference in the grain sizes, that is to say the particle sizes, of the starting powders, the difference between the d50 value of the first piezoelectric layer and the d50 value of the second piezoelectric layer is preferably greater than or equal to 0.1 µm and less than or equal to 1.5 µm, and particularly preferably greater than or equal to 0.3 µm and less than or equal to 1.0 µm. The inventors have discovered that such particle sizes and particle size differences are particularly advantageous for the processability of the piezoelectric component with simultaneous choice of the first and second coercive field strengths.

Furthermore, the first and second piezoelectric layers can differ in the dopants added to them. In particular, the first and second piezoelectric layers can in this case comprise the same ceramic material having the same constituents and the same concentrations, wherein a dopant added to the ceramic material of the first piezoelectric layer is different to the one added to the ceramic material of the second piezoelectric layer. In this case, the first piezoelectric layer can be doped with neodymium (Nd), for example, while the second piezoelectric layer is doped with a mixture of zinc (Zn) and niobium (Nb). Such a dopant combination can be advantageous in particular in the case of PZT, but also in the case of other ceramic materials, as ceramic material for both layers. Furthermore, the first and second piezoelectric layers can have different dopant concentrations. In this case, both layers can also have the same dopant. For PZT as a ceramic material and a mixture of Zn and Nb as dopants, for example, the first piezoelectric layer can have a dopant concentration of 2 mol % and the second piezoelectric layer can have a dopant concentration of 5 mol %. In this case, the respective dopants and dopant concentrations are dependent on the respective ceramic materials and the desired coercive field strengths.

Furthermore, the first piezoelectric layer can have a first thickness and the second piezoelectric layer can have a second thickness, wherein the first and second thicknesses are different from one another. An adaptation of the first and second coercive field strengths can be possible by means of setting of the first and second thicknesses. In particular, in this embodiment, the first piezoelectric layer can be arranged directly adjacent to a first electrode layer and to a second electrode layer, such that the first piezoelectric layer is arranged between a pair formed from the first and second electrode layers. The second piezoelectric layer can be arranged between a further pair formed from a first and a second electrode layer, wherein the first or the second electrode layer is the same for both pairs. In this case, the electric field strength E in the first and second piezoelectric layers is dependent on the applied voltage U and the first and the second layer thickness, respectively, in accordance with the equation $E=U/t$, where t indicates the first or the second thickness. In this case, the first and second piezoelectric layers can comprise the same ceramic material with correspondence in composition, dopants, dopant concentrations and particle sizes, such that the piezoelectric component can be completely produced from the same ceramic material and the first and second coercive field strengths can be set by the distances between first and second electrode layers.

The difference between the first thickness and the second thickness, relative to a normal layer thickness, or the ratio of the first and second thicknesses to one another can preferably be greater than or equal to 1.1 and less than or equal to 3.0, and particularly preferably greater than or equal to 1.3 and less than or equal to 2.5.

In accordance with at least one embodiment, the stack of the piezoelectric component has a sequence of layers arranged directly one above another, wherein the sequence is formed in this order from a first electrode layer, the first piezoelectric layer, a second electrode layer, the second piezoelectric layer and a further first electrode layer. Consequently, the first piezoelectric layer is arranged between in each case one adjacent first and second electrode layer, while the second piezoelectric layer is arranged between the same second electrode and a further first electrode layer adjacent to the second electrode layer.

In accordance with at least one further embodiment, the stack of the piezoelectric component has a sequence of layers arranged directly one above another, wherein the sequence is formed in this order from a first electrode layer, the first piezoelectric layer, the second piezo-electric layer and a second electrode layer adjacent to the first electrode layer. In this case, therefore, the first and second piezoelectric layers are situated between the same pair formed from a first electrode layer and a second electrode layer adjacent thereto.

Furthermore, the two sequences mentioned above can both be arranged in one piezoelectric component.

Furthermore, the stack of the piezoelectric component can have further first piezoelectric layers and at least the one second piezoelectric layer. That can mean, in particular, that the piezoelectric component can have a stack having at least exactly one second piezoelectric layer and a plurality of first piezoelectric layers. Furthermore, the piezoelectric component can also have a plurality of second piezoelectric layers. The stack of the piezoelectric component can have at most the same number of first and second piezoelectric layers, such that half of all the piezoelectric layers in the stack are first or second piezoelectric layers.

Furthermore, the electrode layers can comprise one of the following materials: copper, silver, platinum, an alloy or mixture of copper and palladium, an alloy or mixture of silver and palladium, a mixture or alloy of platinum and silver.

BRIEF DESCRIPTION OF THE DRAWINGS

Further advantages and advantageous embodiments and developments of the invention will become apparent from the embodiments described below in conjunction with FIGS. 1 to 10, where.

Figure 1:
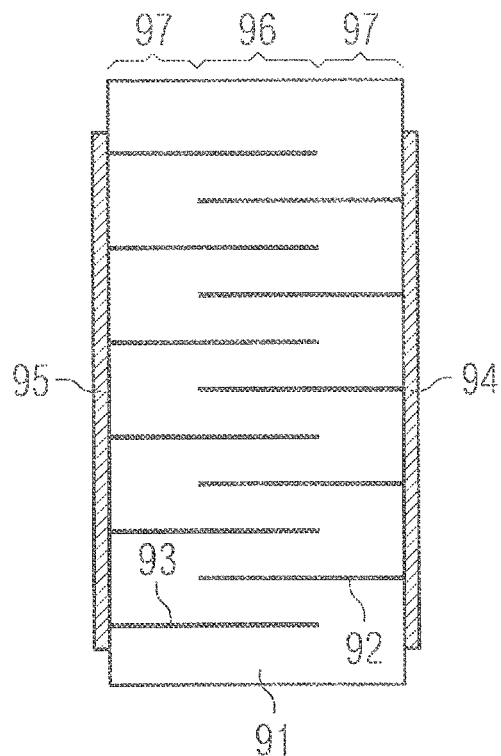
FIG. 1 shows a schematic illustration of a known piezoelectric actuator.

In the exemplary embodiments and figures, identical or identically acting constituent parts can in each case be provided with the same reference symbols. The elements illustrated and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

The following list of reference symbols may be used in conjunction with the drawings:
1 stack
2, 2', 2", 2''' first piezoelectric layer
3, 3', 3", 3''' second piezoelectric layer
4 first electrode layer
5 second electrode layer
6, 6' contact boundary
7 expansion
8 expansion
9 electric field strength
10 coercive field strength
11 morphotropic phase boundary
12 coercive field strength
91 stack
92 internal electrode
93 internal electrode
94 metallization
95 metallization
96 active region
97 inactive region
98 polarization crack
99 polarization crack
101 piezoelectric material
102 piezoelectric material

DETAILED DESCRIPTION OF ILLUSTRATIVE EMBODIMENTS

Figure 2A:
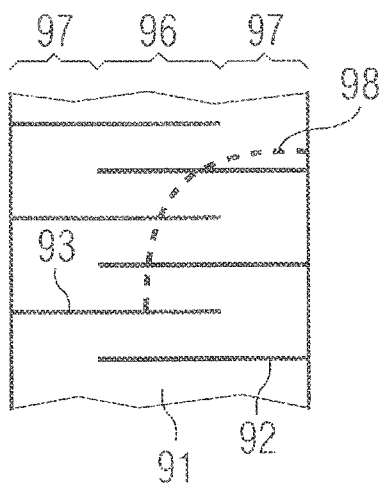
FIGS. 2A and 2B show schematic illustrations of known piezoelectric actuators.
Figure 2B:
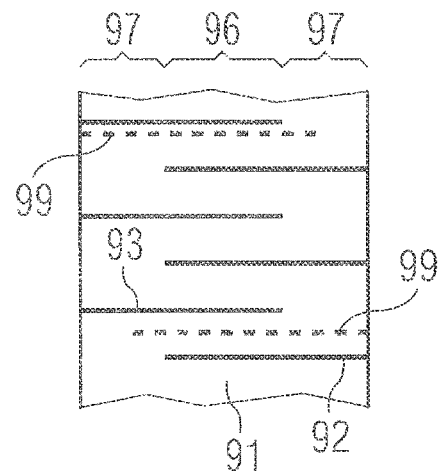

FIG. 1 illustrates a known multilayered piezoelectric actuator comprising a stack 91 having a plurality of layers of a piezoelectric material with internal electrodes 92, 93 between the piezoelectric layers. In this case, the same piezoelectric material is used in the entire actuator. The internal electrodes 92, 93 are in each case embodied in a type of comb structure in the form of intermeshed combs. By means of contact areas in the form of metallizations 94, 95 at the outer side of the stack 91, an electrical voltage can be applied between the internal electrodes 92, 93. In the active region 96 of the stack 91, in which the internal electrodes 92, 93 are arranged alternately one above another, a piezoelectric stroke can be effected by an expansion of the piezoelectric material of the actuator. In the inactive regions 97 of the stack 91, only a very small electric field is built up by the application of an electrical voltage to the internal electrodes 92, 93, such that in these regions the piezoelectric material scarcely contributes to the stroke of the actuator. As a result, tensile stresses arise in the inactive regions 97, which tensile stresses can bring about load-relieving and/or polarization cracks, as is shown schematically in FIGS. 2A and 2B. In this case, as shown in FIG. 2B, polarization cracks 99 can arise which run substantially parallel to the internal electrodes 92, 93. Moreover, in known piezoelectric actuators, however, polarization cracks 98 also arise, as shown in FIG. 2A, which bend away upon transition into the active region 96 and then, as indicated, can bridge internal electrodes, such that short circuits arise. A polarization crack 98 as shown in FIG. 2A leads to the failure of the known piezoelectric actuator from FIG. 1.

Figure 3A:
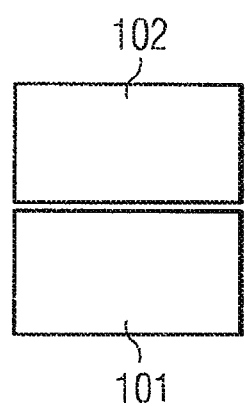
FIGS. 3A to 3C show schematic illustrations of piezoelectric materials in accordance with one embodiment.
Figure 3B:
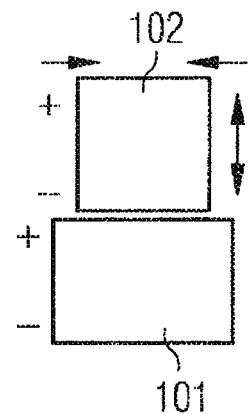
Figure 3C:
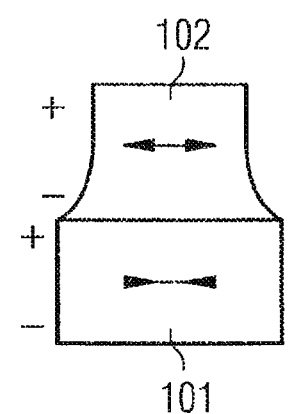

FIGS. 3A to 3C show an exemplary embodiment with schematic illustrations of piezoelectric materials 101, 102 which are intended to clarify the basic concept of the piezoelectric component described here. In this case, the first piezoelectric material 101 has a first coercive field strength and the second piezoelectric material 102 has a second coercive field strength (FIG. 3A), wherein, in the exemplary embodiment shown, the second coercive field strength is less than the first coercive field strength. FIG. 3B schematically shows the deformation of the first and second piezoelectric materials 101, 102 after the application of an electric field (indicated by the positive and negative symbols, electrode layers are not shown) if there is no mechanical contact between the first and second piezoelectric materials 101, 102. In this case, the deformation caused by the electric field is illustrated by the arrows by way of example for the piezoelectric material 102. In this case, the second piezoelectric material 102 having the lower coercive field strength expands to a greater extent than the first piezoelectric material 101. If the piezoelectric materials 101, 102 are brought into contact with one another and are then sintered together, a deformation of the first and second piezoelectric materials 101, 102 arises when an electrical voltage is applied, as shown in FIG. 3C. Since the first and second piezoelectric materials 101, 102 are fixedly connected to one another, at the interface between them elastic stresses arise, which are produced from the different expansions and the resultant tensile stress in the material 102 and the compressive stress in the material 101 (indicated in each case by the double-headed arrows). Consequently, at the contact boundary between the first and second piezoelectric materials 101, 102, a gradient of the elastic stresses is formed, which is intended to lead to the formation of cracks in this region.

Figure 4:
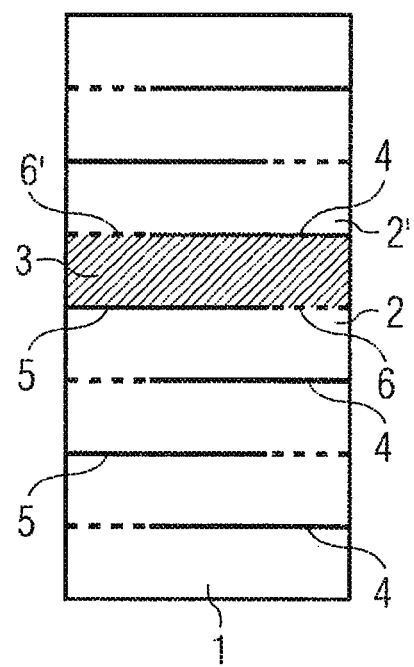
FIG. 4 shows a schematic illustration of a piezoelectric component in accordance with one embodiment.

FIG. 4 shows an exemplary embodiment of a piezoelectric component which is embodied as a piezoactuator of multilayer design and which comprises a stack 1 composed of piezoelectric layers arranged one above another and first and second electrode layers arranged therebetween, wherein, for the sake of clarity, only the piezoelectric layers 2, 2' and 3 and some first electrode layers 4 and second electrode layers 5 are provided with reference symbols. The dashed lines are depicted for clarification of the piezoelectric layers. In this case, the stack 1 has at least one first piezoelectric layer 2 having a first coercive field strength and, directly adjacent thereto, at least one second piezoelectric layer 3 having a second coercive field strength, wherein the first and second coercive field strengths are different from one another. Metallizations at outer sides of the stack 1 in order to make contact with the first and second electrode layers 4, 5 and to connect them to an electrical voltage are not shown. The electrode layers 4, 5 are composed of copper.

The first and second piezoelectric layers 2, 3 are in each case arranged between two adjacent electrode layers 4, 5, such that the stack 1 has a sequence of layers which is formed by a first electrode layer 4, the first piezoelectric layer 2, a second electrode layer 5, the second piezoelectric layer 3 and a further first electrode layer 4. According to the principle described above in FIGS. 3A to 3C, the first and second coercive field strengths differ in such a way that, at the contact boundary 6 between the first and second piezoelectric layers 2, 3, during thermal treatments, during metallization, during soldering, during the polarization process and/or during the operation of the piezoelectric component, local elastic stresses arise which, in the region of the contact boundary, lead to the formation of load-relieving and/or polarization cracks running substantially parallel to the electrode layers 4, 5. Furthermore, the stack 1 has a further first piezoelectric layer 2', which is likewise arranged directly adjacent to the second piezoelectric layer 3 and which has with the latter a further contact boundary 6' at which load-relieving and/or polarization cracks can form in a targeted manner.

In the exemplary embodiment shown, the first piezoelectric layers 2, 2' and the second piezoelectric layer 3 in each case comprise a ceramic material based on PZT, wherein the second piezoelectric layer 3 has a composition having a different concentration of the constituent titanium than the first piezoelectric layers 2, 2'. The layer thicknesses of the piezoelectric layers 2, 2', 3 are identical in the exemplary embodiment shown.

Exemplary embodiments of the elastic expansion and coercive field strengths of such piezoelectric materials are described in connection with FIGS. 8 to 10.

Furthermore, in this and the further exemplary embodiments, the first and second piezoelectric layers can additionally or alternatively also comprise one or more features as described in the general part, for instance different dopants, dopant concentrations, particle sizes or thicknesses.

Figure 5:
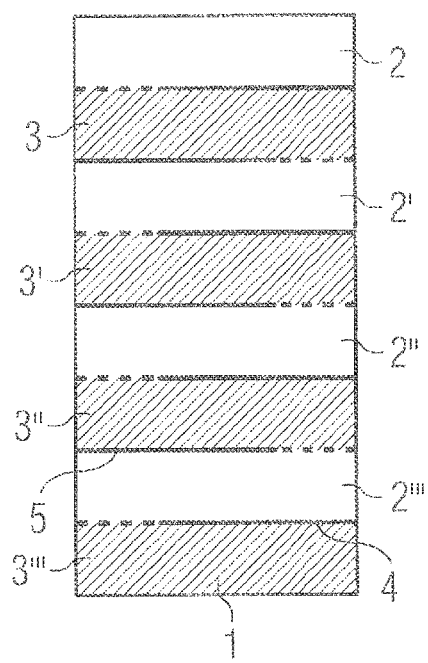
FIG. 5 shows a schematic illustration of a piezoelectric component in accordance with a further embodiment.

FIG. 5 shows a further exemplary embodiment of a piezoelectric component. In comparison with the previous exemplary embodiment, the stack 1 of the piezoelectric component in accordance with FIG. 5 also has, alongside a plurality of first piezoelectric layers, 2, 2', 2", 2'", a plurality of second piezoelectric layers 3, 3', 3", 3'", wherein the first and second piezoelectric layers are arranged alternately one above another, thus resulting in a plurality of contact boundaries at which load-relieving and/or polarization cracks can form in a targeted manner. In this case, the number of second piezoelectric layers, 3, 3', 3", 3'" in relation to the number of first piezoelectric layers 2, 2', 2", 2'" can be chosen according to the respective requirements and the first and second coercive field strengths. In the exemplary embodiment shown, the stack 1 has, purely by way of example, the same number of first and second piezo-electric layers, such that 50% of all the piezoelectric layers in the stack 1 are embodied as second piezoelectric layers.

Figure 6:
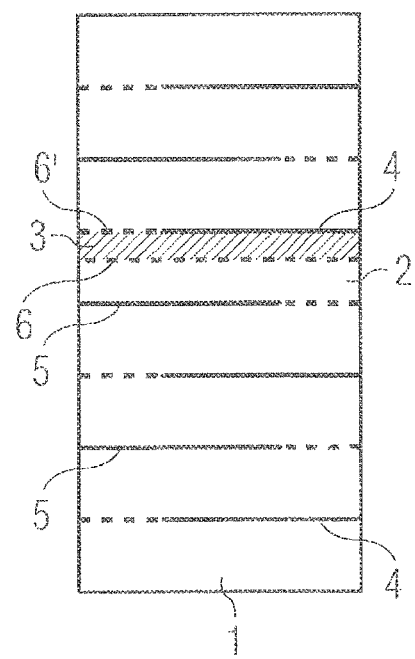
FIG. 6 shows a schematic illustration of a piezoelectric component in accordance with a further embodiment.
Figure 7:
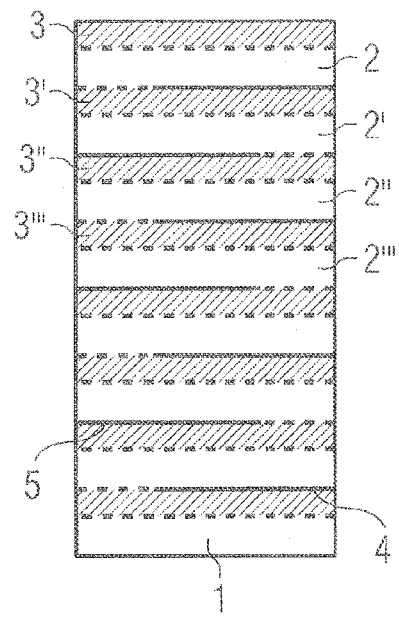
FIG. 7 shows a schematic illustration of a piezoelectric component in accordance with a further embodiment.

FIGS. 6 and 7 show further exemplary embodiments of piezoelectric components that differ from the exemplary embodiments in FIGS. 4 and 5 in that a first and a second piezoelectric layer 2, 3 are arranged directly adjacent to one another and jointly between a first electrode layer 4 and a second electrode layer 5 adjacent thereto. In accordance with the exemplary embodiment in FIG. 7, in this case all the piezoelectric layers between two respectively adjacent electrode layers 4, 5 comprise a first and a second piezoelectric layer 2, 2', 2", 2'", 3, 3', 3", 3'". As an alternative to the exemplary embodiments in FIGS. 6 and 7, it is also possible for more than one first and one second piezoelectric layer to be arranged between two adjacent electrode layers 4, 5. Moreover, the statements made in connection with the exemplary embodiments in FIGS. 4 and 5 also hold true for the exemplary embodiments in FIGS. 6 and 7.

Figure 8:
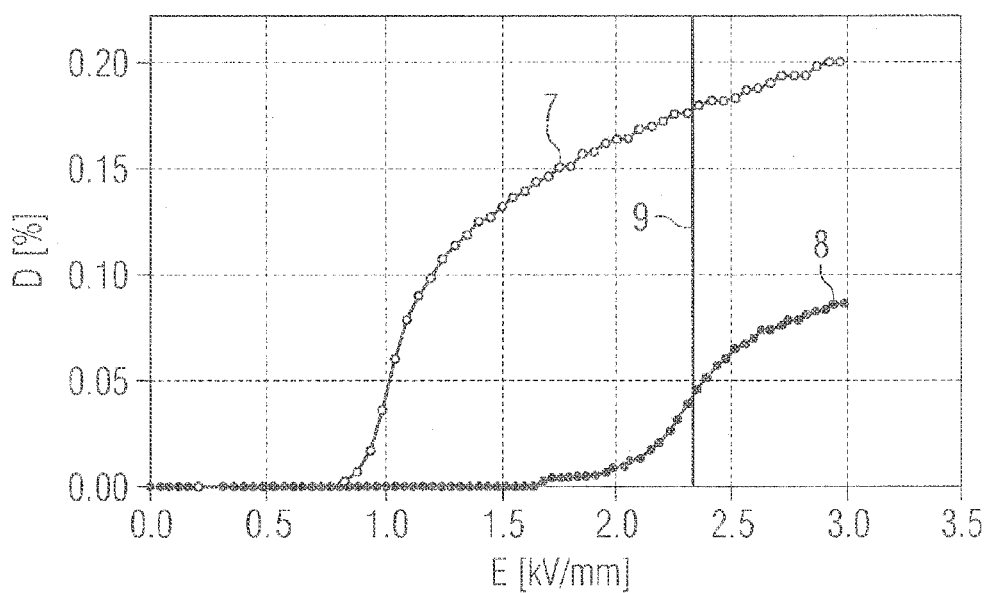
FIGS. 8 to 10 show graphs of different parameters of piezoelectric materials in accordance with further embodiments.

FIG. 8 shows a graph having curves 7, 8 for the elastic expansion D in % as a function of the applied electric field strength E in kV/mm in two different piezoelectric materials shown by way of example in accordance with one exemplary embodiment, from which first and second piezoelectric layers of the previous exemplary embodiments can be produced. The piezo-electric material whose expansion is perpendicular to the electric field is illustrated in curve 7 has a coercive field strength of 1.0 kV/mm, while the piezoelectric material whose expansion is perpendicular to the electric field is shown in curve 8 has a coercive field strength of 2.3 kV/mm. If the applied electric field exceeds the respective coercive field strength, in the piezoelectric material an expansion arises both in the direction of and perpendicular to the applied field (also see FIG. 3B). In the material with regard to curve 7, where the coercive field strength is less than the field strength of 2.3 kV/mm identified by way of example with the reference symbol 9, a high expansion of up to 0.17% is achieved in the direction perpendicular to the applied electric field. By contrast, the material with regard to the curve 8, whose coercive field strength is greater than or, as shown here, comparable with the value of the applied electric field, has a significantly lower expansion of 0.03%.

Figure 9:
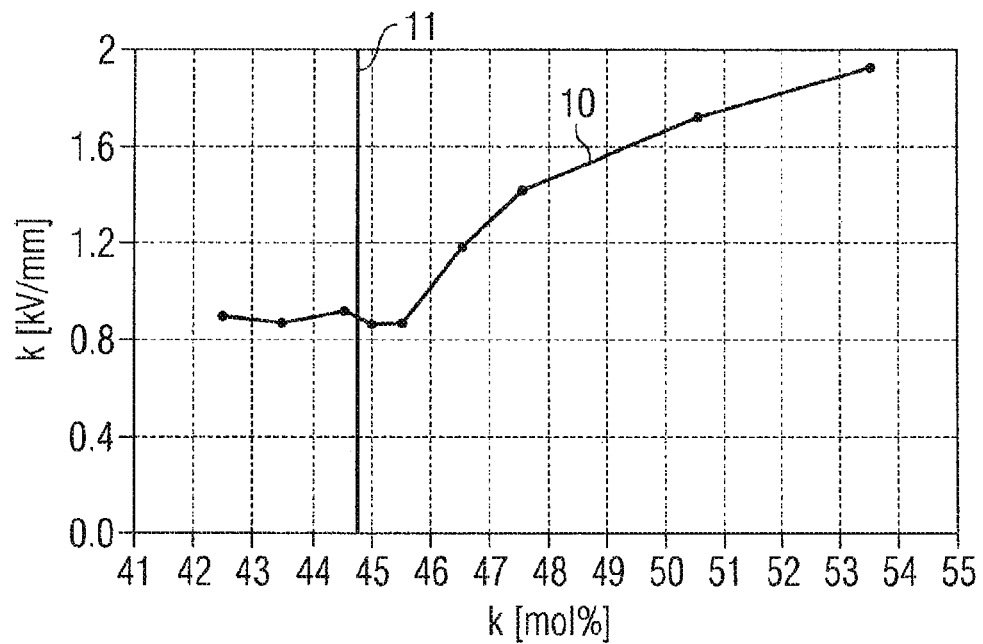

FIG. 9 illustrates a graph of the dependence—shown with curve 10—of the coercive field strength K in kV/mm on the concentration k in mol % of the titanium content in a piezoelectric material based on lead zirconate titanate in accordance with one exemplary embodiment. The reference symbol 11 indicates the morphotropic phase boundary of the piezoelectric material, which lies in the range of between 44 and 46 mol % of the titanium concentration. As the titanium content rises, after the morphotropic phase boundary has been exceeded, a rise in the coercive field strength K can be discerned. As described in the general part, for the first piezoelectric layer and for the second piezoelectric layer it is possible to choose ceramic materials having the same composition which have coercive field strengths on different sides of the morphotropic phase boundary 11. Thus, by way of example, a material having a titanium content of less than approximately 46% can be selected for the first piezoelectric layer and a material having a titanium content of more than approximately 46% can be selected for the second piezoelectric layer, such that the first coercive field strength is less than the second coercive field strength.

Figure 10:
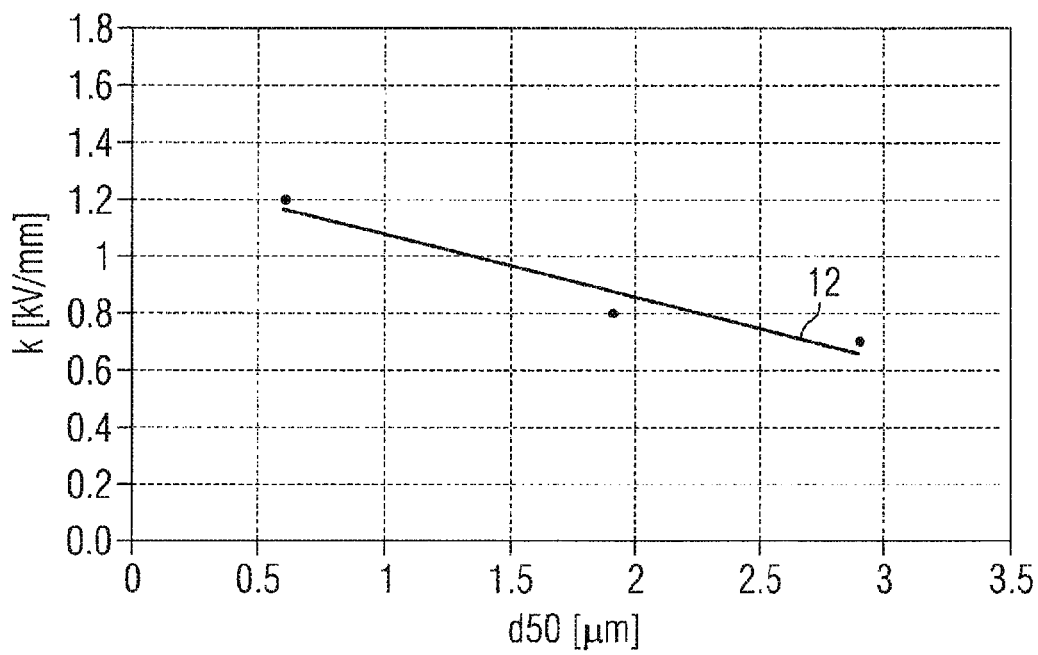

FIG. 10 illustrates a graph of the dependence, shown with curve 12, of the coercive field strength K in kV/mm on the above-described particle size d50 in the ceramic material in accordance with a further exemplary embodiment. The ceramic material investigated in connection with FIG. 10 is based on a PZT ceramic, wherein it can be discerned that as the particle size d50 increases, the coercive field strength of the ceramic material decreases.

The ceramic materials mentioned explicitly above are mentioned purely by way of example and should not be understood as a restriction of the present invention. Rather, the above-described embodiments and exemplary embodiments can also comprise different piezoelectric ceramic materials than the ceramic materials mentioned.

The invention is not restricted to the exemplary embodiments by the description on the basis of the exemplary embodiments. Rather, the invention encompasses any novel feature and also any combination of features, which in particular includes any combination of features in the patent claims, even this feature or this combination itself is not explicitly specified in the patent claims or exemplary embodiments.

What is claimed is:

1. A piezoelectric component comprising:
a stack of piezoelectric layers arranged one above another; and
first and second electrode layers arranged between the piezoelectric layers;
wherein the stack has a first piezoelectric layer having a first electric coercive field strength and, directly adjacent thereto, a second piezoelectric layer having a second electric coercive field strength different than the first electric coercive field strength;
wherein the first piezoelectric layer and the second piezoelectric layer comprise different ceramic materials, different dopants, different dopant concentrations, different particle sizes of starting materials, different layer thicknesses or a combination thereof;

wherein the first and second piezoelectric layers comprise a ceramic material formed from a plurality of constituents having respective concentrations and wherein the first and second piezoelectric layers differ in a concentration of at least one constituent;

wherein the first and second piezoelectric layers comprise a ceramic material having the same constituents;

wherein the ceramic material has, depending on a concentration of at least one first constituent, a morphotropic phase boundary lying between a first structure and a second structure of the ceramic material; and wherein the concentration of a first constituent of the ceramic material in the first and second piezoelectric layers is in each case chosen in such a way that the first piezoelectric layer comprises the ceramic material having the first structure and the second piezoelectric layer comprises the ceramic material having the second structure.

2. The piezoelectric component according to claim 1, wherein the first and second piezoelectric layers differ in exactly one property selected from different ceramic materials, different dopants, different dopant concentrations, different particle sizes of starting materials and different layer thicknesses.

3. The piezoelectric component according to claim 1, wherein the first and second piezoelectric layers comprise ceramic materials produced from starting powders having different particle sizes.

4. The piezoelectric component according to claim 3, wherein the particle size of the starting powders is greater than or equal to 0.3 µm and less than or equal to 2.0 µm, and wherein the difference in the particle sizes of the starting powders is greater than or equal to 0.1 µm and less than or equal to 1.5 µm.

5. The piezoelectric component according to claim 1, wherein the first piezoelectric layer has a first thickness and the second piezoelectric layer has a second thickness that is different from the first thickness.

6. The piezoelectric component according to claim 5, wherein the ratio of the first and second thicknesses is greater than or equal to 1.1 and less than or equal to 3.0.

7. The piezoelectric component according to claim 1, wherein the stack has a sequence of layers arranged directly one above another, and wherein the sequence of layers is formed from the first electrode layer, the first piezoelectric layer, the second electrode layer, the second piezoelectric layer and a further first electrode layer.

8. The piezoelectric component according to claim 1, wherein the stack has a sequence of layers arranged directly one above another, and wherein the sequence of layers is formed from the first electrode layer, the first piezoelectric layer, the second piezoelectric layer and the second electrode layer adjacent to the first electrode layer.

9. The piezoelectric component according to claim 8, wherein the stack has further first piezoelectric layers.

10. The piezoelectric component according to claim 8, wherein the stack has an identical number of first and second piezoelectric layers.

11. The piezoelectric component according to claim 7, wherein the stack has further first piezoelectric layers.

12. The piezoelectric component according to claim 7, wherein the stack has an identical number of first and second piezoelectric layers.

13. A method of making a piezoelectric component, the method comprising:

producing a plurality of green sheets, each green sheet comprising unsintered ceramic powder;

joining the green sheets together with electrode layers; and sintering the green sheets and the electrode layers to form a stack of piezoelectric layers arranged one above another in a stack and first and second electrode layers arranged between the piezoelectric layers;

wherein the stack has a first piezoelectric layer having a first electric coercive field strength and, directly adjacent thereto, a second piezoelectric layer having a second electric coercive field strength different than the first electric coercive field strength;

wherein the first piezoelectric layer and the second piezoelectric layer comprise different ceramic materials, different dopants, different dopant concentrations, different particle sizes of starting materials, different layer thicknesses or a combination thereof;

wherein the first and second piezoelectric layers comprise ceramic materials produced from starting powders having different particle sizes;

wherein the particle size of the starting powders is greater than or equal to 0.3 µm and less than or equal to 2.0 µm; and wherein the difference in the particle sizes of the starting powders is greater than or equal to 0.1 µm and less than or equal to 1.5 µm.

14. The method according to claim 13, wherein the first and second piezoelectric layers comprise a ceramic material formed from a plurality of constituents having respective concentrations, and wherein the first and second piezoelectric layers differ in a concentration of at least one constituent.

15. The method according to claim 14, wherein the first and second piezoelectric layers comprise a ceramic material having the same constituents, wherein the ceramic material has, depending on a concentration of at least one first constituent, a morphotropic phase boundary lying between a first structure and a second structure of the ceramic material, and wherein the concentration of a first constituent of the ceramic material in the first and second piezoelectric layers is in each case chosen in such a way that the first piezoelectric layer comprises the ceramic material having the first structure and the second piezoelectric layer comprises the ceramic material having the second structure.

16. The method according to claim 13, wherein the first and second piezoelectric layers are each chosen in such a way that a contact boundary between the first and second piezoelectric layers forms a region for forming load-relieving and/or polarization cracks that runs substantially parallel to the first and second electrode layers.

17. The method according to claim 13, wherein the first and second piezoelectric layers differ in exactly one property selected from different ceramic materials, different dopants, different dopant concentrations, different particle sizes of starting materials and different layer thicknesses.

18. The method according to claim 13, wherein the first piezoelectric layer has a first thickness and the second piezoelectric layer has a second thickness that is different from the first thickness, wherein the ratio of the first and second thicknesses is greater than or equal to 1.1 and less than or equal to 3.0.

19. The piezoelectric component according to claim 1, wherein the first and second piezoelectric layers are each chosen in such a way that a contact boundary between the first and second piezoelectric layers forms a region for forming load-relieving and/or polarization cracks that runs substantially parallel to the first and second electrode layers.

20. A piezoelectric component comprising:
- a stack of piezoelectric layers arranged one above another; and
- first and second electrode layers arranged between the piezoelectric layers;
- wherein the stack has a first piezoelectric layer having a first electric coercive field strength and, directly adjacent thereto, a second piezoelectric layer having a second electric coercive field strength different than the first electric coercive field strength;
- wherein the first piezoelectric layer and the second piezoelectric layer comprise different ceramic materials, different dopants, different dopant concentrations, different particle sizes of starting materials, different layer thicknesses or a combination thereof;
- wherein the first and second piezoelectric layers comprise ceramic materials produced from starting powders having different particle sizes;
- wherein the particle size of the starting powders is greater than or equal to 0.3 μm and less than or equal to 2.0 μm;
- wherein the difference in the particle sizes of the starting powders is greater than or equal to 0.1 μm and less than or equal to 1.5 μm;
- wherein the first and second piezoelectric layers comprise a ceramic material formed from a plurality of constituents having respective concentrations;
- wherein the first and second piezoelectric layers differ in a concentration of at least one constituent;
- wherein the first and second piezoelectric layers comprise a ceramic material having the same constituents;
- wherein the ceramic material has, depending on a concentration of at least one first constituent, a morphotropic phase boundary lying between a first structure and a second structure of the ceramic material; and
- wherein the concentration of a first constituent of the ceramic material in the first and second piezoelectric layers is in each case chosen in such a way that the first piezoelectric layer comprises the ceramic material having the first structure and the second piezoelectric layer comprises the ceramic material having the second structure.

* * * * *